United States Patent

Clementi et al.

[11] Patent Number: 5,600,166
[45] Date of Patent: Feb. 4, 1997

[54] EPROM CELL WITH A READILY SCALABLE INTERPOLY DIELECTRIC

[75] Inventors: Cesare Clementi, Busto Arsizio; Gabriella Ghidini, Milan; Marina Tosi, Trezzo sull'Adda, all of Italy

[73] Assignee: SGS-Thomson Microelectronics, S.r.l., Agrate Brianza, Italy

[21] Appl. No.: 457,514

[22] Filed: Jun. 1, 1995

Related U.S. Application Data

[62] Division of Ser. No. 67,386, May 26, 1993, Pat. No. 5,422,291.

[30] Foreign Application Priority Data

May 27, 1992 [EP] European Pat. Off. ............ 92830266

[51] Int. Cl.$^6$ .................................................... H01L 29/792
[52] U.S. Cl. ........................ 257/324; 257/325; 257/411; 365/185.01
[58] Field of Search ................................. 257/411, 324, 257/325; 365/185.01

[56] References Cited

U.S. PATENT DOCUMENTS

| | | | |
|---|---|---|---|
| 4,619,034 | 10/1986 | Janning | 257/324 X |
| 4,808,261 | 2/1989 | Ghidini et al. | 156/653 |
| 4,996,081 | 2/1991 | Ellul et al. | 427/96 |
| 5,032,545 | 7/1991 | Doan et al. | 437/242 |
| 5,104,819 | 4/1992 | Freiberger et al. | 437/43 |
| 5,304,829 | 4/1994 | Mori et al. | 257/324 |
| 5,422,291 | 6/1995 | Clementi et al. | 437/43 |

FOREIGN PATENT DOCUMENTS

| | | | |
|---|---|---|---|
| 0383011 | 8/1990 | European Pat. Off. | |
| 62-266872 | 11/1987 | Japan | 257/324 |
| 3-262150 | 11/1991 | Japan | |
| 3-2621150 | 11/1991 | Japan | |

OTHER PUBLICATIONS

Ajika et al., "Enhanced Reliability of Native Oxide Free Capacitor Dielectrics on Rapid Thermal Nitrided Polysilicon", 1989 VLSI Symposium, Technology Digest, 1989, pp. 63–64.
Lo et al., "Polarity Asymmetry of Electrical Characteristics of Thin Nitrided Polyoxides Prepared by In–Situ Multiple Rapid Thermal Processing", Solid State Electronics, vol. 34, No. 2, Feb. 1991, pp. 181–183.
Patent Abstracts of Japan, vol. 16, No. 67 (E–1168), 19 Feb. 1992.
Alvi et al., "Thin Oxide/Nitrided–Oxide Films on Polysilicon Grown by Rapid Transient Processing", Extended Abstracts, vol. 86–2, No. 377, 24 Oct. 1986, p. 565.
Ajika et al., "Formation of Inter–Poly Si Dielectrics by Rapid Thermal Processing", Extended Abstracts of the 19th Conference on Solid State Devices and Materials, Aug. 27 1987, pp. 211–214.

*Primary Examiner*—William Mintel
*Attorney, Agent, or Firm*—Robert Groover; Betty Formby

[57] ABSTRACT

The use of an O—N—RTN (Oxide-Nitride-Rapid Thermal Nitrided Polysilicon) interpoly dielectric multilayer instead of a customary O—N—O (Oxide-Nitride-Oxide) multilayer in the floating gate structure of a programmable, read-only memory cell has beneficial effects on the performance of the cell and facilitates its scaling.

12 Claims, 2 Drawing Sheets

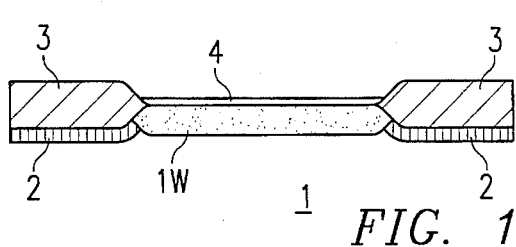
FIG. 1
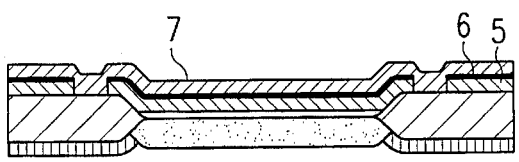
FIG. 5
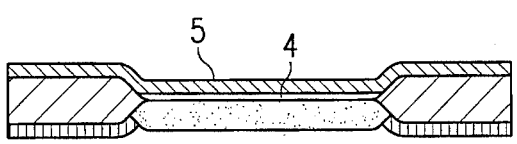
FIG. 2
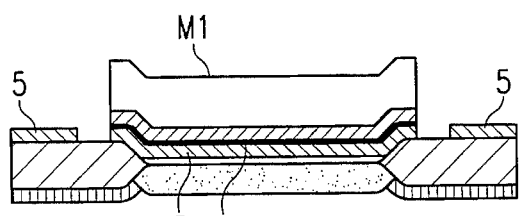
FIG. 6
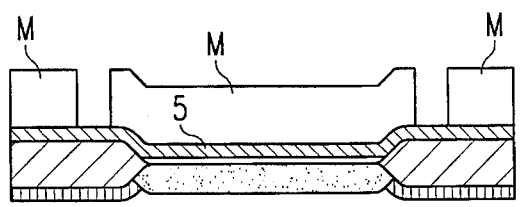
FIG. 3
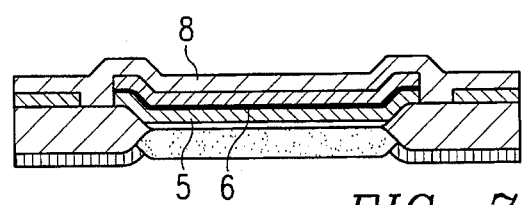
FIG. 7
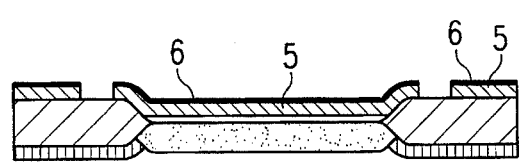
FIG. 4
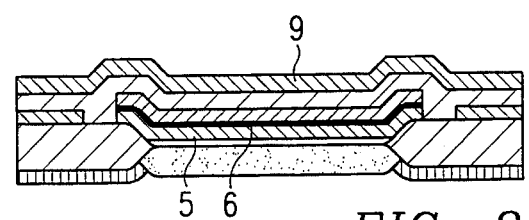
FIG. 8
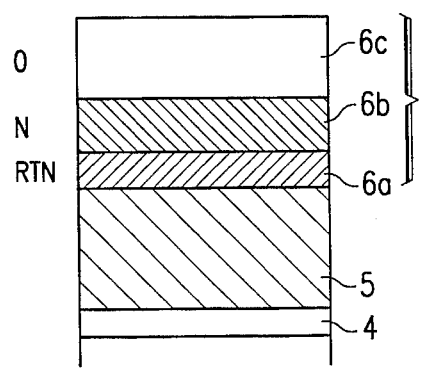
FIG. 4-bis

EPROM CELL WITH A READILY SCALABLE INTERPOLY DIELECTRIC

This is a divisional of Issued Ser. No. 08/067,386, filed May 26, 1993, now U.S. Pat. No. 5,422,291.

BACKGROUND OF THE INVENTION

The present invention relates to nonvolatile, read-only programmable memories, and to processes for fabricating these devices.

Static, electrically programmable, nonvolatile, read-only memories, commonly referred to by the acronym EPROM, are fundamental devices for implementing microprocessor systems. These memories, formed by a matrix of memory cells arranged in rows and columns and individually addressable through row and column decoders, may belong to different "families", in terms of the particular electrophysical mechanism which is used for erasing data electrically recorded in the cells, notably EPROM, E²PROM, and FLASH-EPROM.

Nonvolatile Memory Technologies

Several types of nonvolatile memory devices use principles of operation which exploit the properties of a floating-gate transistor. Such a transistor is different from a normal MOS transistor in that a dielectrically isolated floating gate is interposed between a control gate and the channel. Thus, the two gates are capacitively coupled to each other and to the channel. The lower gate is called a "floating" gate, because it is electrically isolated. By injecting charges into the floating gate, the effective threshold voltage of the MOS transistor (as seen from the upper gate) can be-changed. By applying an appropriate voltage to the control gate, and observing whether the transistor turns on, the state of the cell (i.e. whether charge is stored on the floating gate) can be detected.

An "electrically programmable read-only-memory" (EEPROM) can be electrically written and can be erased by ultraviolet light. EEPROMs are very commonly used, since they are cheap and their timing standards are familiar.

An "electrically erasable programmable read-only-memory" (EEPROM or E²PROM) can be electrically written and electrically erased. EEPROMs are less commonly used than EPROMs, since they tend to be more expensive and to require even higher voltages.

A more recent modification of the EPROM is the "Flash EPROM". This device, like the EEPROM, is electrically erasable, but only in blocks. Although this device does not have the bit-by-bit erasability of the EEPROM, it is much cheaper, and is seeing incresing use in many applications.

In striving to make ever more compact devices (i.e. ULSI devices), it is necessary to reduce the dimensions of the single cells, i.e. the minimum lithographically definable width. Of course, a reduction of the cell area must be accompanied by a correlated reduction of junction depth, i.e. the depth of the diffused regions or simply of the diffusions formed in the semiconducting substrate, as well as of the thickness of the layers which are stacked over the semiconducting substrate. On the other hand, this scaling-down process must preserve the essential electrical characteristics of the integrated structure for a reliable functioning of the memory cell. In other words, beside the problems of photolithographic definition there are technological problems which are connected to a "scaling down" of the various features which form the functional integrated structure of an electrically programmable, nonvolatile memory cell.

In such memories, the dielectric used for isolating a polysilicon floating gate from an overlaying control gate structure has a decisive importance. The insulating dielectric layer between the two conducting layers of the floating gate and of the control gate, respectively, must be capable of preventing any substantial migration of electrical charge from the floating gate toward the control gate. On the other hand, the thickness of this dielectric layer must be as small as possible for determining a good capacitive coupling between the control gate and the floating gate.

Modern devices utilize two superimposed levels of polysilicon. The first (poly I) is used for patterning floating gates of single memory cells (and the gates of the transistors of the external circuitry). The second (poly II) is used for patterning control gate structures (commonly the row lines or wordlines of the cell array.

Reduction of Programming Voltages

Floating-gate memories normally require a high voltage for programming (to get carriers into the dielectrically isolated floating gate). For example, EPROMs which can operate (in read mode) using only 5 V supply and ground, will commonly need a voltage of 10 V or more to achieve programming; EEPROMs may need a voltage of 15 V or more to achieve programming. Special circuit techniques are used to isolate this high voltage, and to prevent it from destroying logic devices which may also be present on the chip. However, the use of high voltage on-chip is a nuisance, and it would be desirable to reduce the needed voltage if this can be done without degrading speed or nonvolatility.

Since no voltage can be directly applied to the floating gate, the voltage between the floating gate and the channel (or source or drain) is created by applying a voltage to the control gate. This voltage will then be divided between the series capacitances:

$$V_{FG/C} = V_{CG/C} - V_{CG/FG}$$

The voltage divides in inverse proportion to the capacitances, so that $$\frac{V_{FG/C}}{V_{CG/FG}} = \frac{C_{CG/FG}}{C_{FG/C}}$$

where:

$C_{CG/FG}$ is the capacitance from control gate to floating gate, $C_{FG/C}$ is the capacitance from floating gate to channel, $V_{CG/FG}$ is the voltage from control gate to floating gate, and $V_{FG/C}$ is the voltage from floating gate to channel.

Since it is desirable to maximize the ratio of $V_{FG/C}$ to $V_{CG/FG}$, it is desirable to maximize the ratio of $C_{CG/FG}$ to $C_{FG/C}$. Since the areas of these capacitors are normally approximately equal, this criterion can be stated equivalently in terms of the specific capacitance (capacitance per unit area) C'. Therefore, we must maximize the ratio of $C'_{CG/FG}$ to $C'_{FG/C}$. Since the specific capacitance $C'_{FG/C}$ is normally due to a thin gate oxide grown on the substrate, it is necessary to have a comparably high specific capacitance (small equivalent thickness) for the thin dielectric film between the floating gate and the control gate. However, it is also necessary to avoid leakage through this dielectric. This is inherently difficult, since oxidation of polysilicon tends to produce rapid growth and high defect density.

In 1980s, device technologists began using an oxide-nitride-oxide ("O—N—O") composite for the interpoly dielectric. (Typically a thin oxide would be grown to seal the polysilicon, then a nitride layer would be deposited, then a reoxidation step would be performed to seal any pinholes and provide the well-known interface characteristics of oxide). This technique provided a small and uniform thickness for the interpoly dielectric, while still preserving a desirably low leakage.

It has been found that such an O—N—O multilayer may be produced with a reduced initial defectivity as compared with an oxide layer produced by directly oxidizing polysilicon. This permits to achieve leakage current levels which are compatible with most stringent specifications of charge retention in the floating gate (i.e. nonvolatility of the stored data). Moreover, the process temperatures reached for depositing a layer of silicon nitride and the temperature for oxidizing the silicon nitride in order to form such a O—N—O multilayer are substantially lower than the temperature which is required to grow an oxide having good dielectric characteristics by direct oxidation of the surface of a doped polysilicon of first level. The possible attendant damage that the other important dielectric layer of the cell structure may be subject to during the relatively high temperature processing, i.e. of the gate oxide that isolates the floating gate from the channel region of the semiconducting substrate and which at this stage of the fabrication process has already been formed, is also considerably reduced by a lower process temperature when forming the interpoly dielectric layer.

Nothwithstanding the fact that the isolating O—N—O multilayer between two levels of polysilicon has represented a remarkable technological step forward in respect to the prior technique of forming a single dielectric layer of oxide, this technique also imposes limitations to the scaling of features, because of a residual, though reduced, density of intrinsic defects of the stacked layers. The bottom layer of oxide of the O—N—O multilayer is in fact particularly sensitive to scaling because of an intrinsic tendency to a substantial defectivity. Moreover, a reduction of the thickness of the deposited nitride layer beyond a certain limit does not ensure a sufficient imperviousness to oxygen during the subsequent thermal oxidation treatment of a top portion of the thickness of the deposited nitride layer in order to form a truly insulating dielectric layer of the floating gate from the control gate. An initial defectivity and a difficulty in preventing a growth of such a bottom oxide layer of the O—N—O structure during the subsequent thermal oxidation step for the formation of the insulating top oxide so layer, reflects negatively on the reliability of manufactured memories.

The possibility of forming a dielectric layer for integrated capacitances which ensure a degree of reliability higher than the O—N—O structure is known. According to this technique, disclosed in the Article: "Enhanced Reliability of Native Oxide Free Capacitor Dielectrics on Rapid Thermal Nitridized Polysilicon" of N. Ajika, et al., 1989 VLSI Symposium, Technology Digest, page 63, the coupling surface area between a first electrode consisting of a doped polysilicon layer is thermally nitridized for depositing on this nitridized surface a layer of silicon nitride whose surface will then be thermally oxidized in order to form a dielectric layer of silicon oxide reportedly having outstanding dielectric characteristics. This ON/RTN multilayer has been proposed as a dielectric multilayer of improved characteristics as compared with an O—N—O dielectric multilayer for making storage capacitances for high density DRAM memories. In this realm of utilization, the dielectric layer doesn't have a function of retaining the electrical charge for a substantially indefinite period of time in absence of a power supply, as is instead the case of nonvolatile, read only memories (ROM).

SUMMARY OF THE INVENTION

It has now been found that it is possible to reduce the problems connected to the scaling down of ROM memories by forming the isolating dielectric between a floating gate (poly I) and a control gate (poly II) by subjecting the surface of a doped polysilicon of first level (poly I) to a rapid thermal nitridization process by treating the deposited and doped polysilicon at a temperature between 900° C. and 1100° C. for a period of time between 15 and 150 seconds, in a nitrogen atmosphere. This produces a nitridized skin or layer by nitridization of the polysilicon onto which a layer of silicon nitride is deposited for a thickness which may be as high as 15 nm. Subsequently, a top surface layer of the deposited silicon nitride is oxidized in the presence of water vapor at a temperature between 900° C. and 1000° C. until a dielectric layer of silicon oxide, whose thickness is preferably between a minimum of about 5 nm and a maximum of about 20 nm, is grown.

Surprisingly, it has been found that, notwithstanding the fact that electrical charge may eventually migrate from the polysilicon of the floating gate through the nitridization layer to the deposited silicon nitride layer, the fundamental electrical parameters of the memory cell do not change. In particular the variation of the threshold voltage of the cell shows a negligeable variation. By contrast, the dielectric layer thus formed shows an excellent ability to retain the electrical charge stored in the floating gate both in terms of retention time and of maximum working temperature, in absence of power supply. In practice, it is possible to form an interpoly dielectric layer having a real thickness comprised between 10 and 30 nm. Moreover the conditions of the thermal treatment (temperature and duration) during the successive steps of nitridization, deposition of silicon nitride and oxidation, are not such as to produce serious damage to the integrity of the dielectric gate layer (gate oxide) present between the floating gate of poly I and the semiconducting substrate.

BRIEF DESCRIPTION OF THE DRAWINGS

FIG. 1 shows the formation of a dielectric gate layer 4 on the active area.

FIG. 2 shows the deposition and subsequent doping of a first polysilicon layer 5 (poly I).

FIG. 3 shows the definition of the first level polysilicon (poly I) by a masking (M) and etching step.

FIGS. 4 and 4bis show the rapid thermal nitridization treatment of the surface of the patterned polysilicon layer 5. FIG. 4bis is an enlarged portion of the cross section of FIG. 4, wherein the stratification is made visible.

FIG. 5 shows the deposition of a "dummy" layer of polysilicon 7 over the dielectric multilayer 6 (O—N—RTN) for protecting the so formed isolation multi-layer 6 (i.e. the oxidized top layer 6c).

FIG. 6 shows the formation of a so-called matrix mask M1 and etching of the dummy layer 7 of polysilicon and of the multilayer O—N—RTN 6 in areas left unmasked by the mask M1.

FIG. 7 shows the removal of the residual masking material and deposition and subsequent doping of a second layer of polysilicon (poly II) 8.

FIG. 8 shows the deposition of a layer 9 of tungsten silicide (WSi2) or of polycrystalline silicon.

DESCRIPTION OF THE PREFERRED EMBODIMENT

Figure 9:
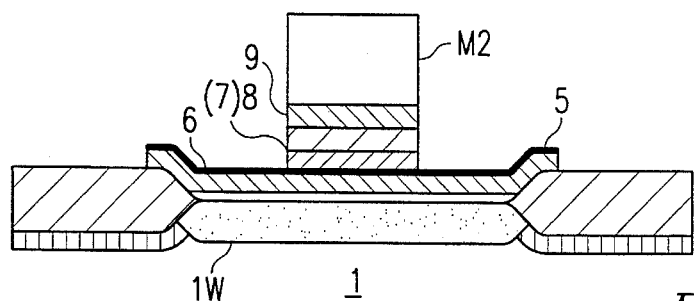
FIG. 9 shows the definition through a so-called poly-II-mask, M2, and subsequent etching of the layer 9 and of the polysilicon silicon layer 8 of second level (poly II).

The figures depict a partial microsection, representative of a single memory cell which is being formed in a well region 1w of a first type of conductivity created in a semiconducting substrate 1 of the same type but of lower conductivity. The active area occupied by the cell is bounded laterally by a diffused isolation region 2 (channel stop region), having a slightly higher conductivity than that of the substrate 1, formed in the semiconductor 1 under the definition edges of a field oxide structure 3. The field oxide layer 3 may be grown by thermally oxidizing the single crystal semiconductor 1 in areas left unmasked by an oxygen impervious layer (commonly a layer of silicon nitride).

Briefly the sequence of steps, as depicted in the figures, is the following.

FIG. 1: formation of a gate dielectric layer 4 on the active area (e.g. by growing, stripping and regrowing an oxide layer of 10 nm or less).

FIG. 2: deposition and subsequent doping of a first polysilicon layer 5 (poly I) of 100 to 150 nm.

FIG. 3: definition of the first level polysilicon (poly I) by a masking (M) and etching step.

FIGS. 4 and 4bis: rapid thermal nitridization treatment of the surface of the patterned polysilicon layer 5 at a temperature between 900° C. and 1100° C., for a time between 15 and 150 seconds in a nitrogen atmosphere, followed by the deposition of a layer of silicon nitride having a thickness of about 12 to 15 nm and a partial oxidation of the thickness of the deposited layer of nitride in presence of water vapor at a temperature comprised between 900° C. and 1000° C., until a dielectric layer of silicon oxide, whose thickness may vary between 5 and 20 nm, is grown.

According to a typical sample implementation, the rapid thermal nitridization of the polysilicon is conducted at 950° C. for 90 seconds. Thereafter silicon nitride is deposited at 780° C. for 5 minutes, using an $NH_3/SiH_2Cl_2$ mixture in a 5/1 ratio by volume, producing a 12 nm thick layer. Oxidation in steam and oxygen at 950° C. is protracted for 2 hrs. causing the growth of a 10 nm thick $SiO_2$ layer. The residual thickness of the partially oxidized layer of silicon nitride (12 nm thick as deposited) is reduced to about 7 nm after oxidation.

FIG. 4bis: is an enlarged portion of the cross section of FIG. 4, wherein the resulting stratification is made visible. The layer 6a represents the nitridized top portion of the layer of the polysilicon 5 (i.e. of the floating gate). The layer 6b represents a residual thickness of the silicon nitride layer deposited over the nitridized layer 6a after oxidation. The layer 6c represents a dielectric layer of silicon oxide grown by oxidising a top portion of the thickness of the deposited silicon nitride.

FIG. 5: deposition of a "dummy" layer of polysilicon 7 over the dielectric multilayer 6 (O—N—RTN) for protecting the so formed isolation multilayer 6 (i.e. the oxidized top layer 6c).

FIG. 6: formation of a so-called matrix mask M1 and etching of the dummy layer 7 of polysilicon and of the multilayer O—N—RTN 6 in areas left unmasked by the mask M1.

FIG. 7: removal of the residual masking material and deposition and subsequent doping of a second layer of polysilicon (poly II) 8.

FIG. 8: optional deposition of a layer 9 of tungsten silicide ($WSi_2$).

FIG. 9: definition through a so-called poly-II-mask, M2, and subsequent etching of the layer 9 and of the polysilicon silicon layer 8 of second level (poly II).

Figure 10:
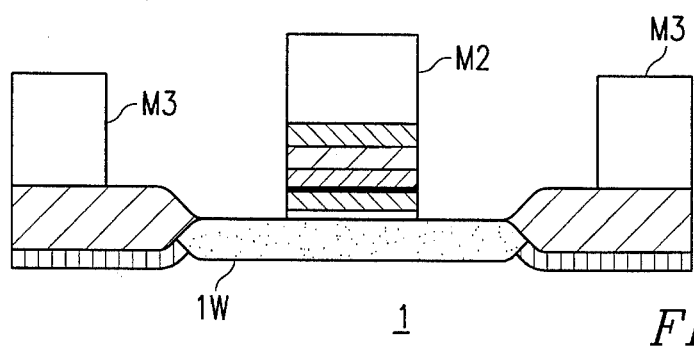
FIG. 10 shows the masking of the area occupied by circuitry external to the memory matrix by means of mask M3 and subsequent self-aligned etching of the stack composed of the interpoly layer 6, the polysilicon layer 5 of first level (poly I) and the underlying layer 4 of gate oxide, until exposing the semiconductor in areas "unmasked" by the gate structure.

FIG. 10: masking of the area occupied by circuitry external to the memory matrix by means of mask M3, while leaving in place the residual mask M2, and subsequent selfaligned etching of the stack composed of the interpoly layer 6, the polysilicon layer 5 of first level (poly I) and the underlying layer 4 of gate oxide, until exposing the semiconductor in areas "unmasked" by the defined gate stack.

Figure 11:
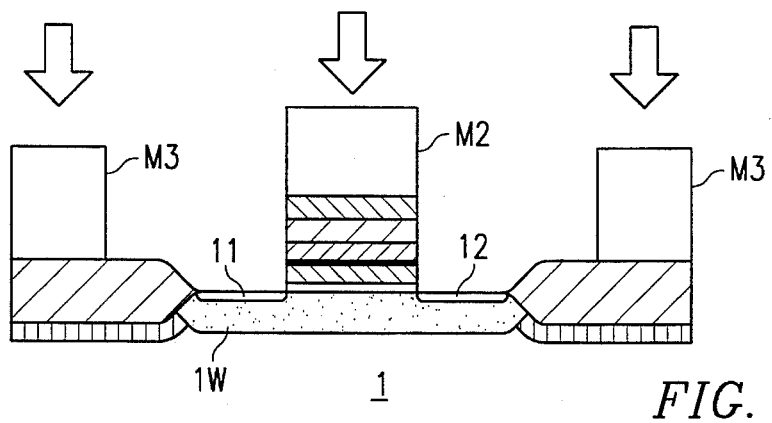
FIG. 11 shows the implantation of a dopant for forming cell junctions 11 and 12 of said first type of conductivity.

FIG. 11: implantation of a dopant for forming cell junctions 11 and 12 of a second type of conductivity (in drain and source areas).

Figure 12:
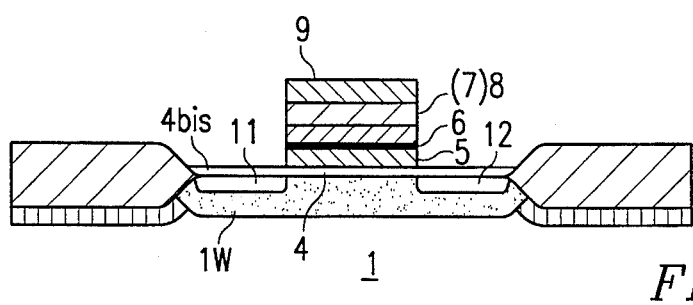
FIG. 12 shows the diffusion of the dopant and reoxidation of the surface of the semiconductor in the source and drain areas of the cell.

FIG. 12: diffusion of the dopant and reoxidation of the surface of the semiconductor in the source and drain areas of the cell.

According to a sample implementation, the semiconducting substrate 1 may be a p-type semiconductor having a level of doping of about $1–5\times10^{16}$ Atoms(B)/cm$^3$. The well region 1w has a doping level of about $1–3\times10^{17}$ Atoms(B)/cm$^3$. The channel stop region 2 has a doping level of about $5–8\times10^{16}$ Atoms(B)/cm$^3$ and the source and drain regions 11 and 12 are n-type regions having a doping level of about $10^{20}$ Atoms(As)/cm$^3$.

Modifications and Variations

The disclosed innovations can also be applied (alternatively and less preferably) to EEPROMs as well as to EPROMs. Of course, as is well-known to those skilled in the art of EEPROM process design, additional steps would have to be taken to form the tunnel oxide.

In a further alternative embodiment, the disclosed innovations can also be applied (alternatively and less preferably) to analog charge-transfer circuits. In such circuits, large integrating capacitors may be used to achieve integration of analog signals with relatively long time constants.

We claim:

1. A programmable nonvolatile read only memory cell having a floating gate of polysilicon to which a control gate is capacitively coupled and electrically isolated therefrom by means of a dielectric multilayer, characterized by the fact that said multilayer consists essentially of:

a first nitridized superficial layer of the polysilicon of said floating gate, formed by treatment in a nitrogen atmosphere at a temperature between 900° C. and 1100° C. for between 15 and 150 seconds;

a second layer of deposited silicon nitride, over said first nitridized layer of polysilicon; and a third dielectric layer constituted by an oxidized top layer of said deposited second layer of silicon nitride, formed by oxidation in the presence of water vapor at a temperature between 900° C. and 1000° C.

2. A memory as defined in claim 1, wherein said deposited second layer of silicon nitride is less than 15 nanometers thick before said third layer is formed by oxidation.

3. A memory as defined in claim 1, wherein said third layer has a thickness of between 5 and 20 nanometers.

4. A nonvolatile read only memory as defined in claim 1, wherein said control gate and floating gate are parts of an electrically programmable memory cell.

5. A nonvolatile read only memory as defined in claim 1, wherein said control gate and floating gate are parts of an electrically programmable and erasable memory cell.

6. A nonvolatile read only memory as defined in claim 1, wherein said control gate and floating gate are parts of an electrically programmable and single-bit-erasable memory cell.

7. A nonvolatile read only memory as defined in claim 1, wherein said first nitridized superficial layer, said second layer of deposited silicon nitride, and said third dielectric layer have a total real thickness in the range of 10–30 nm.

8. A nonvolatile read only memory as defined in claim 1, wherein said second layer of deposited silicon nitride has a thickness of about 12 nm.

9. A nonvolatile read only memory as defined in claim 1, wherein said third dielectric layer has a thickness of about 10 nm.

10. A nonvolatile read only memory as defined in claim 1, wherein said first nitridized superficial layer, said second layer of deposited silicon nitride, and said third dielectric layer have a total real thickness in the range of 10–30 nm.

11. A nonvolatile read only memory as defined in claim 1, wherein said second layer of deposited silicon nitride has a thickness of about 12 nm.

12. A nonvolatile read only memory as defined in claim 1, wherein said third dielectric layer has a thickness of about 10 nm.

\* \* \* \* \*